United States Patent
Goerke

(10) Patent No.: US 8,938,081 B2
(45) Date of Patent: Jan. 20, 2015

(54) TELEPHONE ENHANCEMENTS

(75) Inventor: Lawrence R. Goerke, San Jose, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 593 days.

(21) Appl. No.: 13/172,495

(22) Filed: Jun. 29, 2011

(65) Prior Publication Data

US 2012/0008800 A1    Jan. 12, 2012

Related U.S. Application Data

(60) Provisional application No. 61/361,784, filed on Jul. 6, 2010.

(51) Int. Cl.
*H03G 3/00* (2006.01)
*H03G 3/32* (2006.01)

(52) U.S. Cl.
CPC ........................................ *H03G 3/32* (2013.01)
USPC .............. 381/104; 379/201.01; 379/201.02; 370/260; 370/352; 455/419; 704/225

(58) Field of Classification Search
CPC ..... H04M 3/22; H04M 3/42; H04M 3/42127; H04M 2203/551; H04B 1/40; H04B 1/60; H03G 3/32
USPC ...................... 381/56–57, 110–111, 104, 107; 434/185, 236–238; 704/270–274; 379/88.16, 201.01–201.02; 370/260, 370/352
See application file for complete search history.

(56) References Cited

U.S. PATENT DOCUMENTS

| | | | |
|---|---|---|---|
| 4,020,567 A * | 5/1977 | Webster | 434/185 |
| 5,712,954 A * | 1/1998 | Dezonno | 704/225 |
| 5,852,769 A * | 12/1998 | Ahmed et al. | 455/116 |
| 6,907,277 B1 | 6/2005 | Shim | |
| 6,947,892 B1 * | 9/2005 | Bauer et al. | 704/233 |
| 6,993,480 B1 | 1/2006 | Klayman | |
| 7,088,828 B1 | 8/2006 | Bradford | |
| 7,142,894 B2 * | 11/2006 | Ichikawa et al. | 455/569.1 |
| 7,529,545 B2 | 5/2009 | Rader | |
| 8,054,964 B2 * | 11/2011 | Flockhart et al. | 379/265.07 |

(Continued)

FOREIGN PATENT DOCUMENTS

| | | |
|---|---|---|
| CN | 201131028 | 10/2008 |
| KR | 10-0664268 | 1/2007 |
| KR | 10-2007-0030100 | 3/2007 |

*Primary Examiner* — Davetta W Goins
*Assistant Examiner* — Oyesola C Ojo

(57) ABSTRACT

A telephone user's speech volume is monitored in relation to a minimum volume sufficient for a remote conversant, with whom the user communicates, to audibly perceive the user's speech. Upon detecting that the user's volume exceeds the level sufficient to communication, it is determined whether the user moderates the volume, without being prompted, to the sufficient level. Upon determining that the user moderates the speaking voice without being prompted, positive reinforcement is provided to the user. Results are recorded over multiple phone calls. A frequency of the user moderating the speaking volume without being prompted is tracked from the recorded results. Upon the frequency of the user moderating the volume without being prompted rising over the tracked phone calls, the quality and/or quantity of the positive reinforcement may be improved. The user is thus trained or treated, e.g., audiologically or therapeutically, to self-modulate the volume.

26 Claims, 4 Drawing Sheets

(56) References Cited

U.S. PATENT DOCUMENTS

| | | |
|---|---|---|
| 8,094,790 B2 * | 1/2012 | Conway et al. ............ 379/88.16 |
| 8,374,888 B2 * | 2/2013 | Earles et al. ....................... 705/2 |
| 2001/0029449 A1 | 10/2001 | Tsurufuji |
| 2004/0162722 A1 | 8/2004 | Rex |
| 2004/0242160 A1 * | 12/2004 | Ichikawa et al. ........... 455/67.13 |
| 2006/0080092 A1 | 4/2006 | Sherman |
| 2006/0088154 A1 | 4/2006 | Mukhtar |
| 2006/0135139 A1 | 6/2006 | Cheng |
| 2006/0224046 A1 * | 10/2006 | Ramadas et al. .............. 600/300 |
| 2007/0286386 A1 * | 12/2007 | Denenberg et al. ...... 379/202.01 |
| 2008/0167878 A1 * | 7/2008 | Hause et al. .................. 704/270 |
| 2009/0024759 A1 | 1/2009 | McKibben |
| 2009/0063141 A1 | 3/2009 | Huang |
| 2010/0070266 A1 * | 3/2010 | McNeill et al. ............... 704/201 |
| 2010/0311405 A1 * | 12/2010 | Yang ............................ 455/419 |

* cited by examiner

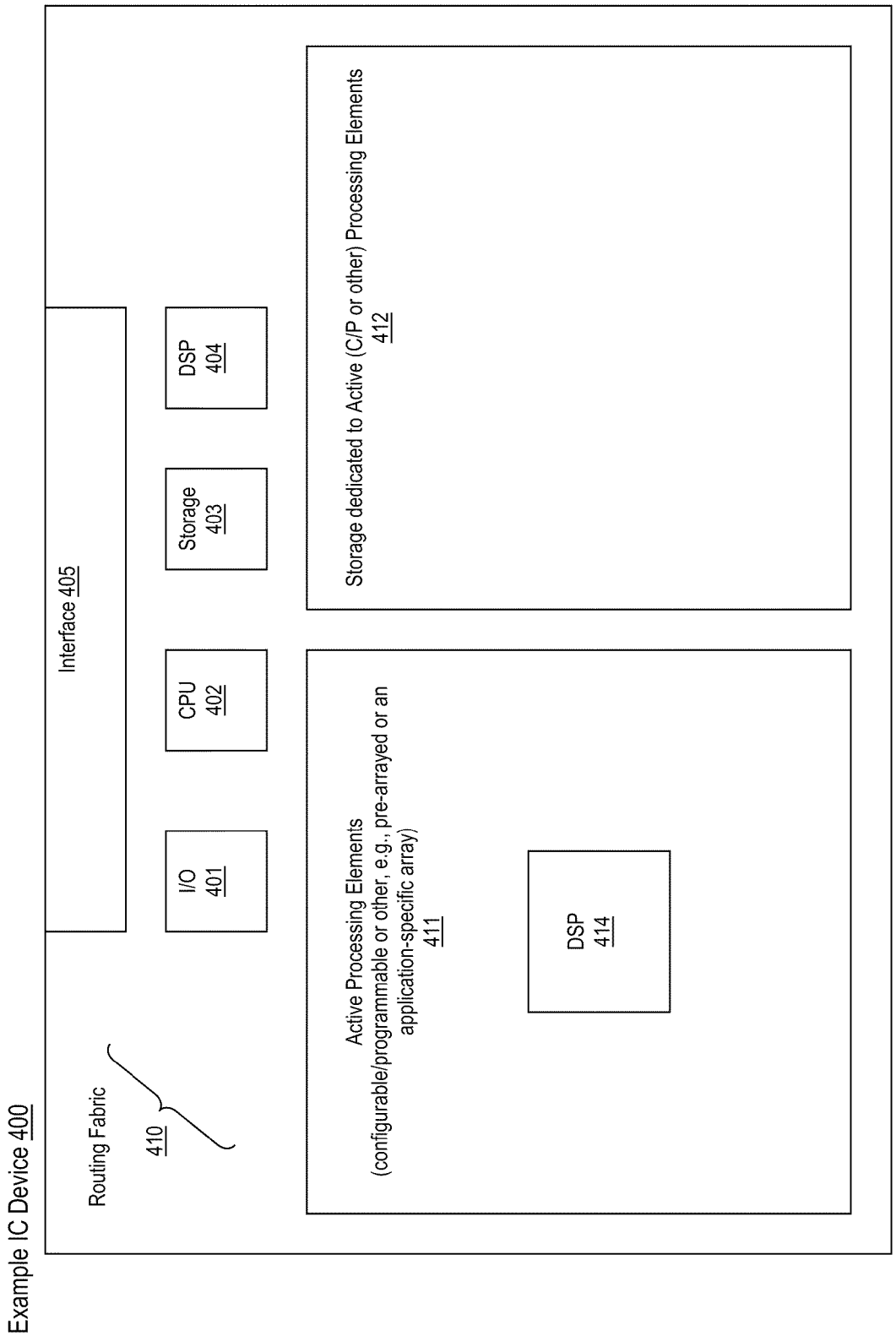

TELEPHONE ENHANCEMENTS

RELATED U.S. APPLICATION & PRIORITY CLAIM

This application claims the benefit of priority to related, Provisional U.S. Patent Application No. 61/361,784 filed on 6 Jul. 2010 entitled 'Telephone Enhancements' by Lawrence R. Goerke, Jr., which is assigned to Dolby Laboratories Licensing Corporation.

TECHNOLOGY

The present invention relates generally to telephony. More particularly, an embodiment of the present invention relates to telephone enhancements.

BACKGROUND

Cellular or mobile telephones ("cell phones") and other, similarly capable mobile or portable devices such as the personal digital assistant (PDA) and a host of related or similar consumer electronic, networking, communicating and/or computing devices ("cell phones and related devices"), have become commonplace. Cell phones and related devices allow users to communicate telephonically at will from virtually any location (e.g., within the range or expanse of a cell phone network). Cell phones are said to have effectively "tied the phone to the user, instead of to a particular location," as with conventional "land-line" telephones. So popular & widely used as they are, cell phones find application in a virtually limitless settings, situations and circumstances. For instance, cell phone users may hold telephonic conversations "in public," a feature rather uncommon with typical landline phones, except "pay phones" and other publicly situated telephones, such as those in prisons, mental health facilities, charity hospitals, military barracks, hotel lobbies, and similar institutional settings.

Cell phones are often used on commuter trains, busses and the like, or while attending private or public gatherings such as parties, dances, conventions and the like. These use milieus typically share at least one significant trait: rather loud levels of ambient noise. When users converse over their phones in high noise environments, they may experience difficulty hearing the party with whom they are conversing over the phone. Sometimes, noise or the resulting difficulty in hearing a party on the phone may compromise users' ability to effectively modulate or moderate the volume of their own telephone speaking voice. Unable to modulate their own volume, users often, consciously or unconsciously, raise their own speaking volume. While this tendency to raise their volume is not effective in improving their hearing, it does seem to be a sort of a natural reaction, perhaps somewhat reflexive, among many telephone users in high noise areas. Users of fixed location (e.g., wire line, landline connected) telephones may be affected as well as users of cell phones and related devices.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF THE DRAWINGS

An embodiment of the present invention is illustrated by way of example, and not by way of limitation, in the figures of the accompanying drawings and in which like reference numerals refer to similar elements and in which:

FIG. 4 depicts an example device, with which an embodiment of the present invention may be practiced.

DESCRIPTION OF EXAMPLE EMBODIMENTS

Figure 1:
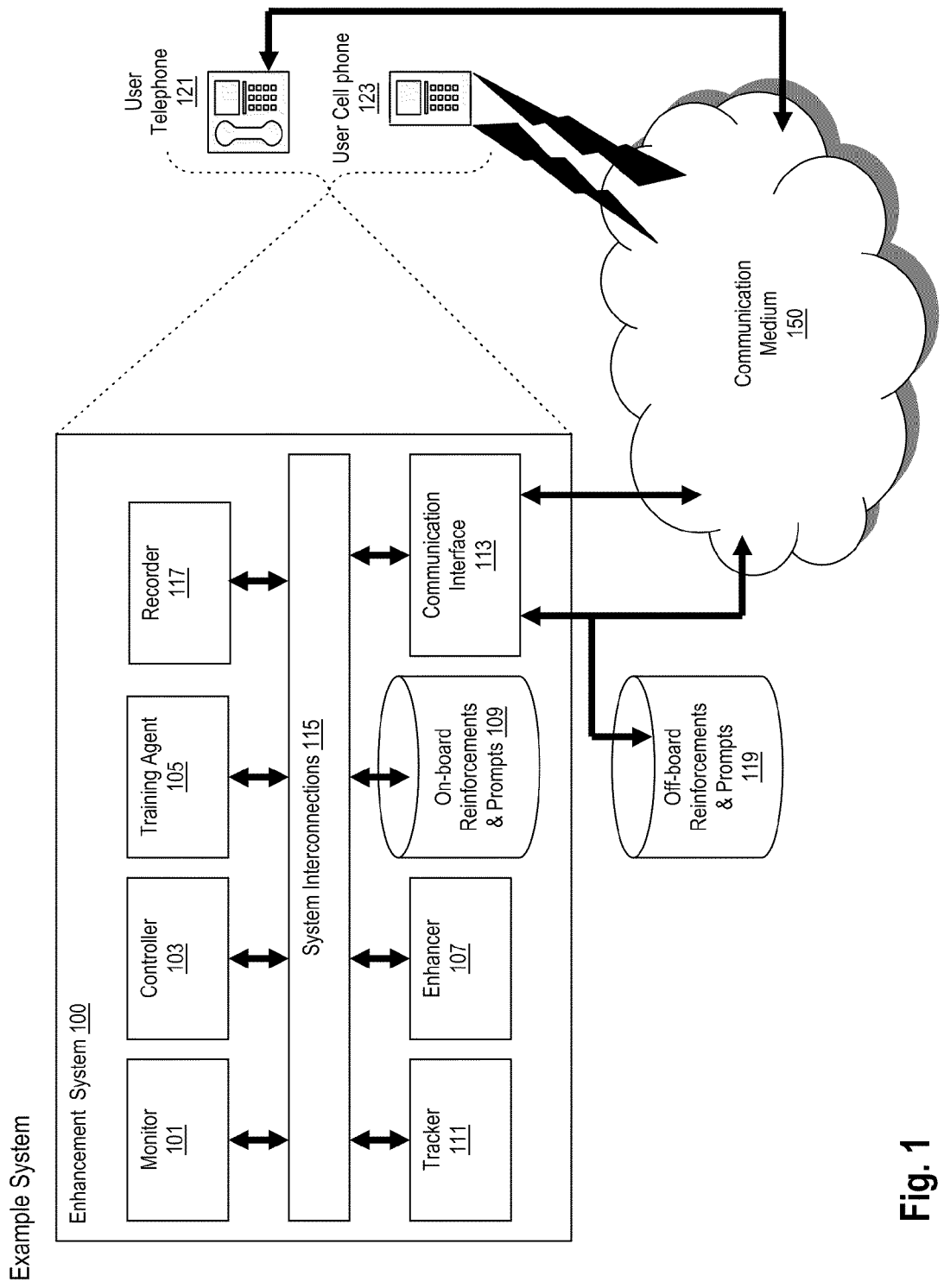
FIG. 1 depicts an example system, according to an embodiment of the present invention.

Telephone enhancements are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Overview

Example embodiments described herein relate to telephone enhancements. An embodiment enhances telephone features and uses for the hearing handicapped and other users of a telephone. A telephone user's speech volume is monitored in relation to a minimum volume sufficient for a remote conversant, with whom the user communicates, to audibly perceive the user's speech. Upon detecting that the user's volume exceeds the level sufficient to allow communication, it is determined whether the user moderates the volume, without being prompted, to the sufficient level. Upon determining that the user moderates the speaking voice without being prompted, positive reinforcement is provided to the user. Results may be recorded over multiple phone calls. A frequency of the user moderating the speaking volume without being prompted may be tracked from the recorded results. Upon the frequency of the user moderating the volume without being prompted rising over the tracked phone calls, the quality and/or quantity of the positive reinforcement may be improved. The user is thus trained or treated, e.g., audiologically or therapeutically, to self-modulate the volume.

Example Telephone Application

An embodiment relates to cellular telephones and other wireless portable communication and computing devices, such as a portable digital assistant (PDA), Droid™, Blackberry™, iPhone™ and similar consumer electronic products, as well as telephones that are associated with a fixed (or relatively limited) location and/or connected with or via a wire line and/or a land line that comprises optically and/or electrically transmissive or conductive media ("fixed location phones").

Cell phones are often used on commuter trains, busses and the like, or while attending private or public gatherings such as parties, dances, conventions and the like. These use milieus typically share at least one significant trait: rather loud levels of ambient noise. Fixed location phones may also be used in areas of high noise. When users converse over their phones in high noise environments, they may experience difficulty hearing the party with whom they are conversing over the phone. Sometimes, noise or the resulting difficulty in hearing a party on the phone may compromise users' ability to effectively modulate or moderate the volume of their own telephone speaking voice. Unable to modulate their own volume, users often, consciously or unconsciously, raise their own speaking volume. While this tendency to raise their volume is not effective in improving their hearing, it does seem to be a sort of a natural reaction, perhaps somewhat reflexive, among many telephone users in high noise areas. Users of fixed location (e.g., wire line, landline connected) telephones may be affected as well as users of cell phones and related devices.

This tendency seems to be somewhat common among many telephone users, most of whom enjoy more or less normal hearing. As used herein (e.g., in the immediately foregoing and/or next sentences), the term 'normal' may be used to refer to one or more of an audiological or a statistical connotation, context, definition, or inference in relation to a qualitative or quantitative aspect or characteristic of a user's human psychoacoustic capability. However, a significant number of telephone users may lack normal hearing in one or more ways. For example, a significant number of cell phone users suffer from at least one of a variety of hearing handicaps or disabilities. Some hearing handicaps can significantly, even substantially degrade a sufferer's ability to effectively moderate the volume and tone of their own voice. These disabilities can exacerbate the tendency for a phone user to raise their voice in a noisy environment.

Hearing handicaps that so degrade the ability for a victim to effectively moderate the volume of their voice are often suffered even in typical face to face conversations with other people; perhaps significantly more often when talking over a cell phone. Monauralism is an example of one such hearing handicap. Monaural individuals, perhaps especially those who may have lost total (or most) hearing in one ear may be particularly vexed with this volume moderation disability. Phone use in a loud environment may thus cause hearing handicapped users to raise their voices to volumes that may be disproportionately loud for the circumstances, perhaps even more than users with normal hearing.

For example, a monaural person's already compromised ability to smoothly moderate their voice volume in face-to-face conversations is almost always degraded in loud rooms (e.g., with relatively loud music and/or multiple relatively loud surrounding conversations) or passenger rail cars, on account of the increased background noise. Passenger rail cars may be a pertinent noise example, as the background noise in which cell phones may be used there typically combines not only track, wheel, machinery, vibrational, rattling, grinding, squeaking, squealing and various metallic-like noises, but loud face to face conversations as well, and even other "loud" cell phone conversations.

Ambient noise in such milieus can, and often does affect even people fortunate enough to enjoy normal binaural hearing. A typical result of these deleterious affects is that cell phone and other phone users in general, and monaural and other hearing handicapped users in particular, may find themselves speaking louder than they need to, to be understood by a listener on the other end of the telephone connection. This tendency to speak louder than necessary can be annoying to other people in earshot and may be embarrassing to the user.

Only a given, typically "reasonable" speaking volume is needed with most cell phones for a speaker to be clearly understood by a remote listener with whom they are conversing over the phone. While ambient noise may affect this level, some cell phones can detect the speaker's voice volume as a signal and discriminate ambient sound volume as noise. Some cell phones may compute a corresponding relationship between the signal and the noise, such as a signal to noise ratio (SNR), from the speaker's voice signal and the ambient noise. The computed signal to noise relationship can be used to generate level adjustments, which while the user is in that ambient sound field, can help keep the speaker's voice signal intelligible to a remote conversant with whom the user is communicating via the phone.

An embodiment relates to enhancements that may help users, including the hearing handicapped, to more effectively communicate using telephones and to learn to self-moderate their telephone speaking volume in various noise environments and other settings.

Example Processes

A speaking volume of a telephone user's voice is monitored in relation to a minimum volume that is computed to be sufficient for a remote conversant, with whom the user communicates with the telephone, to audibly perceive the telephone user's speech. Upon detecting that the user's monitored speaking volume exceeds the computed level that suffices to allow the remote conversant to perceive the user's speech, it is determined whether the user moderates the speaking voice, without being prompted in relation to the excessive speaking volume, to a level that at least approximates the computed minimum sufficient volume. The computed sufficient volume level may be measured in relation to a threshold level. The threshold level may comprise a preset volume level or a volume level that is adjustable in response to a range or to a change in an ambient noise level that is proximate to the user telephone. Upon determining that the user moderates the speaking voice, without being prompted, to a level that approximates the computed minimum volume that suffices to communicate effectively, a positive reinforcement is provided to the user.

An embodiment records a result for the monitoring of the telephone user's voice in relation to the minimum sufficient volume and the determination of whether the user moderates the speaking voice without being prompted over multiple phone calls made by the user, e.g., over a period of time. The recorded result may include a stored and indexed set of relative levels of the user speaking volume prior and subsequent to the moderating of the user speaking voice. From the recorded result, it is tracked whether a frequency of the user moderating the speaking volume without being prompted rises over the multiple phone calls. Upon the rate of occurrences of the user moderating the speaking volume without being prompted rising over the user's multiple phone calls, an embodiment improves a quality related to (or associated with) the positive reinforcement and/or a quantity thereof. Users may thus be trained to self-modulate their telephonic speaking voice volumes. An embodiment thus relates to an audiological training method or therapeutic approach.

Monitoring the user's volume, recording the result thereof, and/or tracking the frequency of the user moderating the speaking volume without being prompted therewith may be performed continuously, periodically, discretely or persistently. The monitoring, recording and/or tracking may be performed locally or proximately in relation to the user's phone, such as with a component of the phone. Additionally or alternatively, the monitoring, recording and/or tracking may be performed remotely in relation to the user's phone, such as with a component or an entity of the communication medium, internet or telephone network with which the phone functions.

Upon determining that the user does not moderate the speaking voice volume to a level that approximates the computed minimum sufficient volume, an embodiment prompts the user to moderate the speaking volume. Prompting the user may include notifying the user in relation to the excessive volume level and allowing the user to attempt to moderate the volume level. The monitoring of the user speaking volume continues upon the prompt, and may persist for a given or adjustable time period. Upon the user moderating the volume, in response to the prompt, the moderation may be reinforced, e.g., with a positive reinforcement. If there is no significant change in the speaking volume following the prompt, the prompt may be repeated and augmented, e.g., with an enhanced prompt.

The telephone renders the positive reinforcement and the prompt to the user audibly, perceptually or subliminally. While the positive reinforcements and the prompt are rendered audibly to the telephone user however, neither the positive reinforcements nor the prompt are sent or made audible to a remote conversant, with whom the user communicates over the telephone.

The positive reinforcement and the prompt may be pre-recorded or pre-selected sounds, sound snippets, voice, music or tones. For example, the positive reinforcements may comprise pre-recorded or pre-selected sound snippets. The user may pre-select or pre-record a voice that has a timbre or other characteristic which, from at least a subjective perspective of the user, is pleasant. The user may pre-select or pre-record an affirmation. The user may pre-select or pre-record a snippet of a favorite song, a melody, harmony or rhythm which, from at least the user's subjective perspective, is pleasant. The user may pre-select or pre-record a variety of positive reinforcements. The user may pre-select or pre-record a mixture of several sounds, such as the pleasant voice over a musical background, or even the two sounds mixed with a subliminal affirmation that may be perceived, yet below a consciousness threshold.

The positive reinforcements may be recorded, stored, indexed, accessed and rendered locally or proximately in relation to the telephone. For example, the positive reinforcements may be recorded, stored, indexed, accessed and rendered with one or more on-board components of the telephone. The positive reinforcements may be recorded with the microphone component of the phone or downloaded over a network and stored in on-board storage media of the telephone, such as a miniature hard drive or a flash memory component. Additionally or alternatively, the positive reinforcements may be recorded, stored, indexed, and/or accessed remotely in relation to the telephone. For example, the positive reinforcements may be stored, indexed, and/or accessed with one or more entities that are associated with the telephone network, internet or communications medium with which the telephone functions, such as a router, switch, server, gateway or mobile switching center.

Similarly, the prompts may be pre-selected and/or pre-recorded by the user. Additionally or alternatively, the prompts may be generated by an enhancement component of the telephone or the telephone network. The prompts may be recorded, stored, indexed, accessed and rendered locally or proximately in relation to the telephone. Additionally or alternatively, the prompts may be recorded, stored, indexed, and/or accessed remotely in relation to the telephone, for example one or more entities that are associated with the telephone network, internet or communications medium with which the telephone functions.

Determining whether the user moderates the speaking voice without being prompted may be conducted over a time period. The time period may comprise a pre-set time span, a threshold time span, a programmable, changeable, controllable or adjustable time span, a variable time span, or a constant time span, or the time period may change from one to another. The threshold time span, the programmable, changeable, controllable or adjustable time span, and/or the variable time span may be changeable, controllable, adjustable or variable based, at least partially, on a change in the frequency of the user moderating the speaking volume without being prompted. For example, as the user self-moderates the volume more frequently over the monitored time period, the time period may be truncated or shortened. The user may then have less time, upon detection of an excessive speaking volume, in which to self-moderate before being prompted. The user is thus further trained to self modulate the speaking voice volume.

The time period changeability, controllability, adjustability or variability may relate to the improvement in the quality and/or quantity of the positive reinforcement. Thus, a user who successfully self moderates the volume without being prompted as the time period shortens may be reinforced with a positive reinforcement that endures for a longer time, or which is more preferable or pleasing to the user from at least a subjective perspective. For example, the vocal affirmations may become more cheerful or encouraging, or the music selection may shift to a more favored song.

Upon detecting that user moderates the volume before being prompted the user's moderating behavior may be further reinforced, such as with further, longer or more preferable or pleasing positive reinforcement. Thus, the user is further trained to self-moderate the volume.

Monitoring the speaking volume and/or the determination of whether the user self-moderates the volume may include monitoring an ambient noise level that is associated with user's phone, and or the telephone of the remote conversant, in relation to a volume that suffices to allow the remote conversant, with whom the user communicates with a call over the telephones, to perceive the speech of the user, e.g., intelligibly or at a level sufficient to allow verbal telephonic communication to proceed.

Upon detecting that the user's speaking volume is insufficient for the remote conversant to understand the user's speech, the user may be prompted in relation to the insufficient speaking volume. For example, the prompt may inform the user to raise the speaking volume to a level that is computed to suffice to allow the remote conversant to perceive the speech of the user.

An embodiment monitors an effectiveness of the positive reinforcements. The positive reinforcements may be changed to improve the training of the user to self-moderate the volume. In many cases, a user may simply speak more softly to self-moderate the volume.

An embodiment may execute, perform, or implement these techniques with a variety of systems, networks, communication and/or computing apparatus, integrated circuit (IC) devices, including microprocessors, digital signal processors (DSP), configurable or programmable logic devices such as gate arrays (e.g., FPGA) and microcontrollers, and application specific ICs (ASIC). Functions and/or components may include hardware (e.g., components or devices), software (e.g., modules or code), firmware and combinations thereof.

Example Enhancement System and Network Environment

FIG. 1 depicts an example system 100, according to an embodiment of the present invention. System 100 functions to provide telephone enhancements, as described herein. System 100, or at least a portion thereof, may comprise, or be disposed with, a component of a user telephone 121 or a user cell phone 123. Additionally or alternatively, system 100, or at least a portion thereof, may comprise, or be disposed with, an entity associated with, or a component of, a communications medium and/or network 150 with which the telephone functions. The communications medium or network 150 may comprise a telephone network or the Internet. Components of system 100 may comprise hardware, software, firmware or combinations thereof and may be implemented with a computer and/or communication apparatus or a component thereof, such as an integrated circuit (IC) device.

System 100 may be communicatively coupled or otherwise function with user telephone 121 via a communication medium or network 150 using optically transmissive or electrically conductive wire lines, land lines, telephone wires (e.g., shielded twisted pair or coaxial cable) or fiber optics. System 100 has a communication interface 113. Communication interface 113 communicatively couples system 100 to communications medium or network 150. User cell phone 121 may be communicatively coupled wirelessly with the communication medium or network 150.

System 100 has a monitor component 101. Monitor 101 continuously, periodically or discretely detects, samples, observes and/or follows the speaking volume of the telephone user's voice. Monitor 100 detects, samples, observes or follows the volume in relation to a minimum volume level that is computed to be sufficient for a remote conversant, with whom the user communicates with the telephone, to audibly perceive the user's speech.

System 100 has a controller 103. Upon monitor 101 detecting that the user's monitored speaking volume exceeds the computed level that suffices to allow the remote conversant to perceive the user's speech, controller 103 determines whether the user self-moderates the speaking voice volume. Controller 103 makes the determination based on the user self-moderating the volume, without being prompted in relation to the excessive level thereof, to a level that at least approximates the computed minimum sufficient volume.

System 100 has a training agent (e.g., component) 105. Upon controller 103 determining that the user moderates the speaking voice, without being prompted, to a level that approximates the computed minimum sufficient volume, training agent 105 provides a positive reinforcement to the user.

Figure 2:
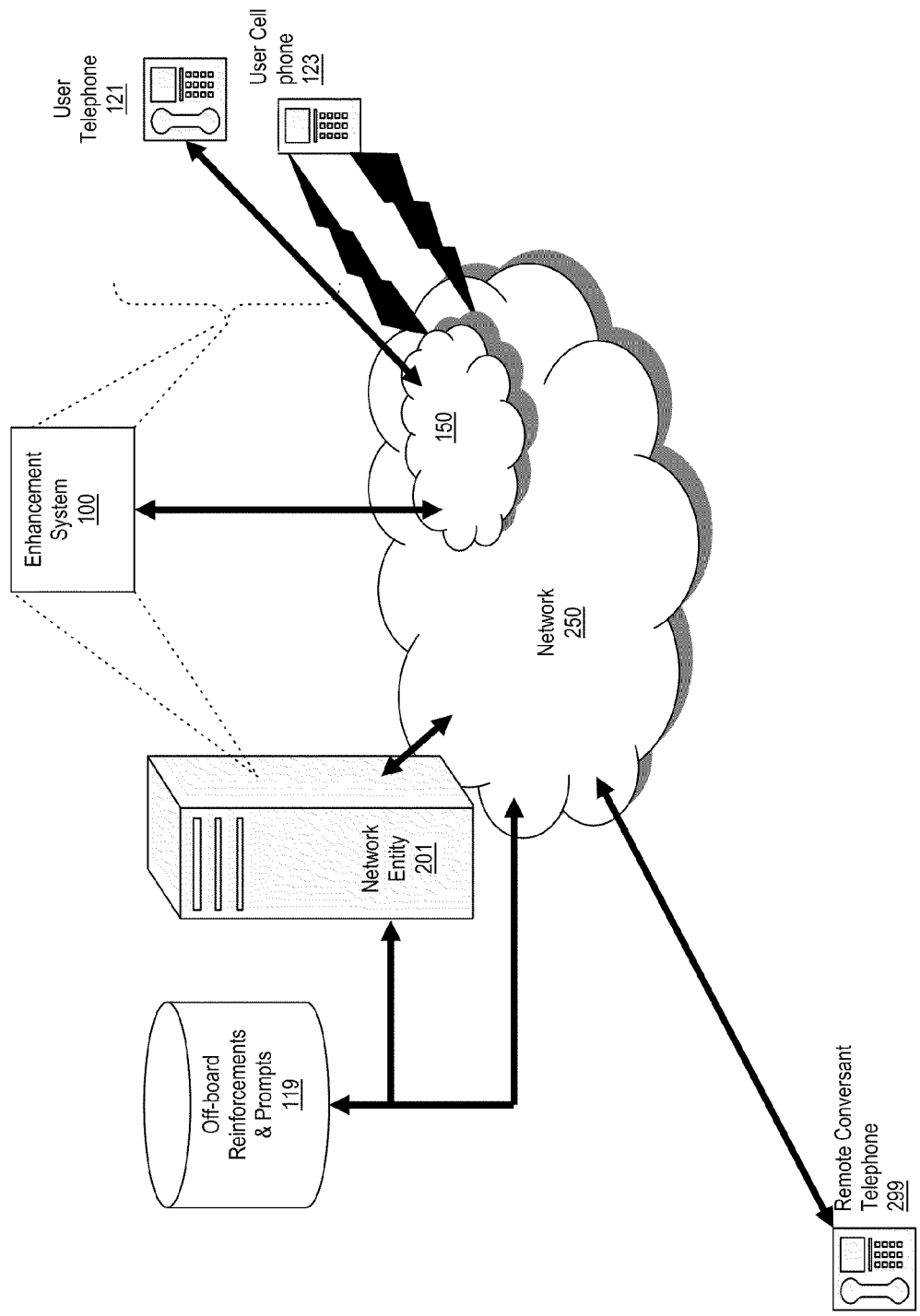
FIG. 2 depicts an example network environment, according to an embodiment of the present invention.

In an embodiment, system 100 has a recorder component 117. Recorder 117 records a result for the monitor 101 and/or the controller 103 over multiple user phone calls. System 100 may also have a tracker 111. Tracker 111 tracks, from the result recorded with recorder 117, whether a frequency of the user moderating the speaking volume without being prompted rises over the multiple user phone calls. System 100 may distinguish between calls made by various or different users of the same telephone. For example, a component of user telephone 121 or user cell phone 123 may discriminate between the voices of particular users thereof, such as with matching an audiogram sampled and processed from a given user's active voiceprint, from a pre-recorded or reference audiogram. Additionally or alternatively for example, a component of an entity of communication medium or network 150 (e.g., network entity 201; FIG. 2) may discriminate between users and their telephones using any of a variety of telephonic techniques, such as code division multiple access (CDMA) or time division multiple access (TDMA) approaches.

System 100 may also have an enhancement component 107. Upon the frequency of the user self-moderating the speaking volume without being prompted rising over the course of the user's multiple phone calls, enhancer 107 improves a quality and/or a quantity of the positive reinforcement. System 100 thus provides training to a user. In at least a sense, system 100 provides the user with an audiological training technique or therapeutic approach or treatment process, with which the user is trained to self-moderate the speaking voice volume.

Positive reinforcements and/or prompts may be stored locally or proximately in relation to system 100 with on-board storage medium 109. The positive reinforcements and/or the prompts may be adjustably, controllably or programmatically set, recorded, indexed, accessed, retrieved and/or rendered from on-board storage medium 109. However, an embodiment may additionally or alternatively store the positive reinforcements and/or the prompts remotely in relation to system 100 with off-board storage medium 119. System 100 may access off-board storage medium 119 via the communication medium or network 150. The positive reinforcements and/or the prompts may be adjustably, controllably or programmatically set, recorded, updated, indexed, accessed, retrieved and/or rendered from off-board storage medium 119.

FIG. 2 depicts an example network environment 200, according to an embodiment of the present invention. Network environment 200 includes a network 250. Network 250 may include, or comprise a component of, the internet or a telephone network. The communication medium or network 150 may comprise a component of, or be communicatively coupled with, network 250. Enhancement system 100 may be communicatively coupled with network 250. In an embodiment, enhancement system 100 is communicatively coupled with network 250 with or via communication medium or network 150. Enhancement system 100 may comprise a component of user telephone 121 and/or user cell phone 123. Additionally or alternatively, enhancement system 100 may comprise a component of an entity 201 that is associated with or communicatively coupled to, or which itself comprises a component of, network 250, such as a telephone switching station, a router, a switch, or a server, etc.

Off-board reinforcements and prompts 119 may be communicatively coupled to system 100 via network 250. Additionally or alternatively, off-board reinforcements and prompts 119 may comprise a component of, or be communicatively coupled directly with network entity 201. A telephone 299, with which a remote conversant may communicate with the user of system 100, may be coupled to telephone 121 and/or cell phone 123 via the network 250.

Example Computer System Implementation Platform

Embodiments of the present invention may be implemented with a computer system, systems configured in electronic circuitry and components, an integrated circuit (IC) device such as a microcontroller, a field programmable gate array (FPGA), or another configurable or programmable logic device (PLD), a discrete time or digital signal processor (DSP), an application specific IC (ASIC), and/or apparatus that includes one or more of such systems, devices or components. The computer and/or IC may perform, control or execute instructions relating to telephone enhancements, such as are described herein. The computer and/or IC may compute any of a variety of parameters or values that relate to the telephone enhancements, e.g., as described herein. The telephone enhancement embodiments may be implemented in hardware, software, firmware and various combinations thereof, e.g., as hardware components or devices, or as modules of code or other software.

Figure 3:
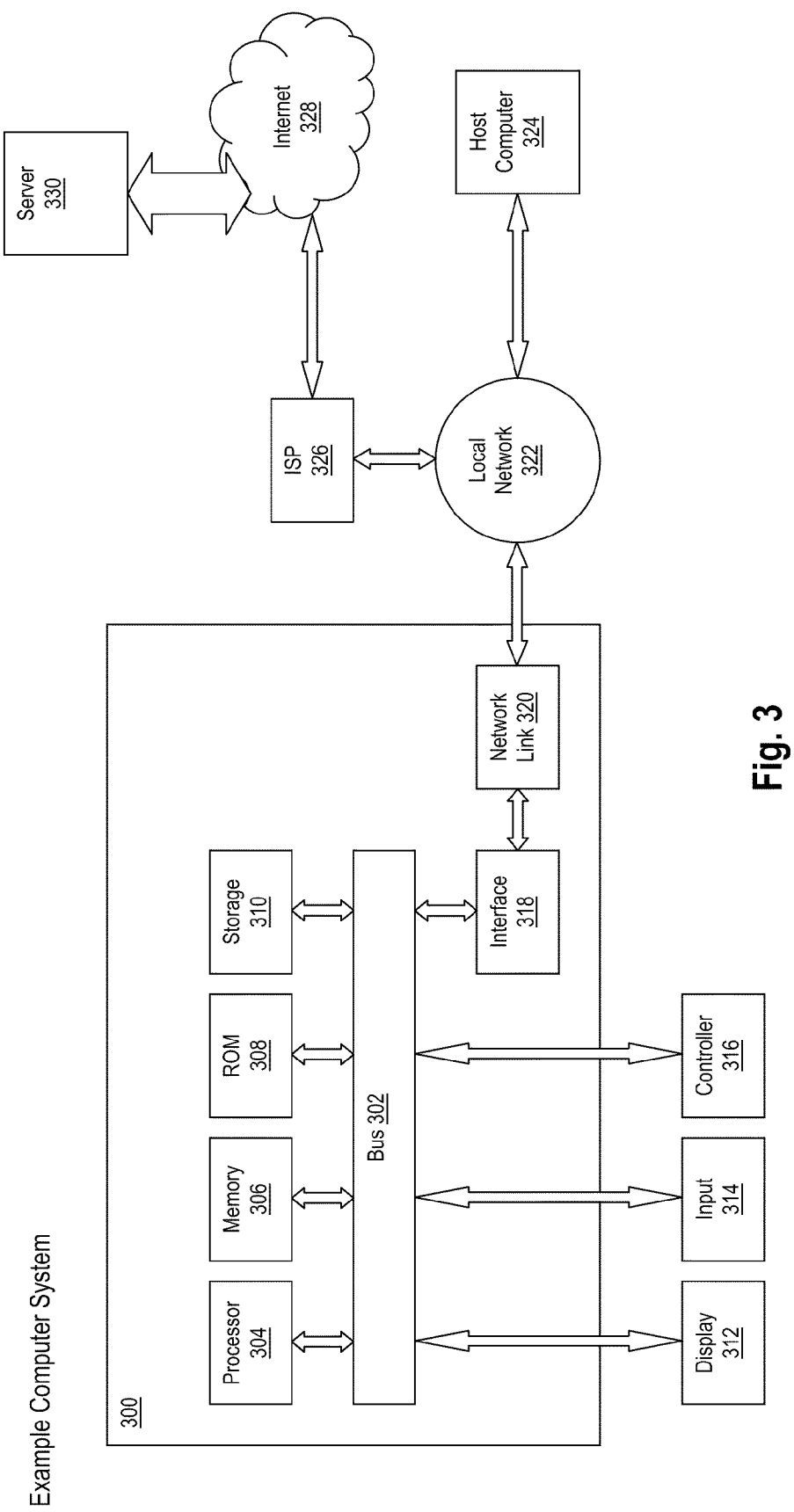
FIG. 3 depicts an example platform, with which an embodiment of the present invention may be practiced.

FIG. 3 depicts an example computer system platform 300, with which an embodiment of the present invention may be implemented. Computer system 300 includes a bus 302 or other communication mechanism for communicating information, and a processor 304 coupled with bus 302 for processing information. Computer system 300 also includes a main memory 306, such as a random access memory (RAM) or other dynamic storage device, coupled to bus 302 for storing information and instructions to be executed by processor 304. Main memory 306 also may be used for storing temporary variables or other intermediate information during execution of instructions to be executed by processor 304.

Computer system 300 further includes a read only memory (ROM) 308 or other static storage device coupled to bus 302 for storing static information and instructions for processor 304. A storage device 310, such as a magnetic disk or optical disk, is provided and coupled to bus 302 for storing information and instructions. Processor 304 may perform one or more digital signal processing (DSP) functions. Additionally or alternatively, DSP functions may be performed by another processor or entity (represented herein with processor 304).

Computer system 300 may be coupled via bus 302 to a display 312, such as a liquid crystal display (LCD), cathode ray tube (CRT), plasma display or the like, for displaying information to a computer user. In cell phone applications, LCDs or "thin" or "cold cathode" CRTs may be used with some regularity. An input device 314, including alphanumeric and other keys, is coupled to bus 302 for communicating information and command selections to processor 304. Another type of user input device is cursor control 316, such as haptic-enabled "touch-screen" GUI displays or a mouse, a trackball, or cursor direction keys for communicating direction information and command selections to processor 304 and for controlling cursor movement on display 312. Such input devices typically have two degrees of freedom in two axes, a first axis (e.g., x) and a second axis (e.g., y), which allows the device to specify positions in a plane. Some phones with simpler keyboards may implement this or a similar feature haptically using a touch-screen GUI display and/or with a set of directionally active "arrow" keys.

Embodiments of the invention relate to the use of computer system 300 for telephone enhancements, such as the positive reinforcement related audiological training and other embodiments described herein. An embodiment of the present invention relates to the use of computer system 300 to compute telephone enhancements, as described herein. According to an embodiment of the invention, positive reinforcements are provided to phone users who self-moderate their speaking volume before being prompted to do so in response detecting a volume that is excessive in relation to a volume that suffices to sustain a telephonic conversation. This feature is provided, controlled, enabled or allowed with computer system 300 functioning in response to processor 304 executing one or more sequences of one or more instructions contained in main memory 306. Such instructions may be read into main memory 306 from another computer-readable medium, such as storage device 310. Execution of the sequences of instructions contained in main memory 306 causes processor 304 to perform the process steps described herein. One or more processors in a multi-processing arrangement may also be employed to execute the sequences of instructions contained in main memory 306. In alternative embodiments, hard-wired circuitry may be used in place of or in combination with software instructions to implement the invention. Thus, embodiments of the invention are not limited to any specific combination of hardware, circuitry, firmware and/or software.

The terms "computer-readable medium" and/or "computer-readable storage medium" as used herein may refer to any medium that participates in providing instructions to processor 304 for execution. Such a medium may take many forms, including but not limited to, non-volatile media, volatile media, and transmission media. Non-volatile media includes, for example, optical or magnetic disks, such as storage device 310. Volatile media includes dynamic memory, such as main memory 306. Transmission media includes coaxial cables, copper wire and other conductors and fiber optics, including the wires (or other conductors or optics) that comprise bus 302. Transmission media can also take the form of acoustic (e.g., sound) or electromagnetic (e.g., light) waves, such as those generated during radio wave and infrared and other optical data communications.

Common forms of computer-readable media include, for example, a floppy disk, a flexible disk, hard disk, magnetic tape, or any other magnetic medium, a CD-ROM, any other optical medium, punch cards, paper tape, any other legacy or other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 304 for execution. For example, the instructions may initially be carried on a magnetic disk of a remote computer. The remote computer can load the instructions into its dynamic memory and send the instructions over a telephone line using a modem. A modem local to computer system 300 can receive the data on the telephone line and use an infrared transmitter to convert the data to an infrared signal. An infrared detector coupled to bus 302 can receive the data carried in the infrared signal and place the data on bus 302. Bus 302 carries the data to main memory 306, from which processor 304 retrieves and executes the instructions. The instructions received by main memory 306 may optionally be stored on storage device 310 either before or after execution by processor 304.

Computer system 300 also includes a communication interface 318 coupled to bus 302. Communication interface 318 provides a two-way data communication coupling to a network link 320 that is connected to a local network 322. For example, communication interface 318 may be an integrated services digital network (ISDN) card or a digital subscriber line (DSL), cable or other modem to provide a data communication connection to a corresponding type of telephone line. As another example, communication interface 318 may be a local area network (LAN) card to provide a data communication connection to a compatible LAN. Wireless links may also be implemented. In any such implementation, communication interface 318 sends and receives electrical, electromagnetic or optical signals that carry digital data streams representing various types of information.

Network link 320 typically provides data communication through one or more networks to other data devices. For example, network link 320 may provide a connection through local network 322 to a host computer 324 or to data equipment operated by an Internet Service Provider (ISP) (or telephone switching company) 326. In an embodiment, local network 322 may comprise a communication medium with which a user's telephone functions. ISP 326 in turn provides data communication services through the worldwide packet data communication network now commonly referred to as the "Internet" 328. Local network 322 and Internet 328 both use electrical, electromagnetic or optical signals that carry digital data streams. The signals through the various networks and the signals on network link 320 and through communication interface 318, which carry the digital data to and from computer system 300, are exemplary forms of carrier waves transporting the information. Computer system 300 can send messages and receive data, including program code, through the network(s), network link 320 and communication interface 318.

In the Internet example, a server 330 might transmit a requested code for an application program through Internet 328, ISP 326, local network 322 and communication interface 318. In an embodiment of the invention, one such downloaded application provides for telephone enhancements described herein. The positive reinforcements and/or the prompts described herein may also be thus downloaded.

The received code may be executed by processor 304 as it is received, and/or stored in storage device 310, or other non-volatile storage for later execution. In this manner, computer system 300 may obtain application code in the form of a carrier wave.

Example IC Device Platform

FIG. 4 depicts an example IC device 400, with which an embodiment of the present invention may be implemented, e.g., for telephone enhancements, e.g., as described herein. IC device 400 may comprise a component of a user's cell phone or other telephone, in which the component functions in relation to the enhancements described herein. Additionally or alternatively, IC device 400 may comprise a component of an entity, apparatus or system that is associated with a communication medium, the Internet or a telephone network or another network with which the user's telephone functions, in which the component functions in relation to the enhancements described herein.

IC device 400 may have an input/output (I/O) feature 401. I/O feature 401 receives input signals and routes them via routing fabric 410 to a central processing unit (CPU) 402, which functions with storage 403. I/O feature 401 also receives output signals from other component features of IC device 400 and may control a part of the signal flow over routing fabric 410. A digital signal processing (DSP) feature performs at least function relating to discrete time signal processing. An interface 405 accesses external signals and routes them to I/O feature 301, and allows IC device 400 to export signals. Routing fabric 410 routes signals and power between the various component features of IC device 400.

Active elements 411 may comprise configurable and/or programmable processing elements (CPPE) 411, such as arrays of logic gates that may perform dedicated functions of IC device 400, which in an embodiment may relate to extracting and processing media fingerprints that reliably conform to media content. Additionally or alternatively, active elements 411 may comprise pre-arrayed (e.g., especially designed, arrayed, laid-out, photolithographically etched and/or electrically or electronically interconnected and gated) field effect transistors (FETs) or bipolar logic devices, e.g., wherein IC device 400 comprises an ASIC. Storage 412 dedicates sufficient memory cells for CPPE (or other active elements) 411 to function efficiently. CPPE (or other active elements) 411 may include one or more dedicated DSP features 414.

Thus, an embodiment of the present invention is described that relates to one or more of the example embodiments, enumerated below.

1. A method, comprising:
   monitoring a speaking volume of a telephone user's voice in relation to a minimum volume that is computed to be sufficient for a remote conversant, with whom the user communicates with the telephone, to audibly perceive the user's speech;
   upon detecting that the user's monitored speaking volume exceeds the computed level that suffices to allow the remote conversant to perceive the user's speech, determining whether the user moderates the speaking voice, without being prompted in relation to the excessive speaking volume, to a level that at least approximates the computed minimum sufficient volume;
   upon determining that the user moderates the speaking voice, without being prompted, to a level that approximates the computed minimum sufficient volume, providing a positive reinforcement to the user.

2. The method as recited in enumerated example embodiment 1, further comprising:
   recording a result for the monitoring step and the determining step over a plurality of the user's phone calls;
   from the recorded result, tracking whether a frequency of the user moderating the speaking volume without being prompted rises over the plurality of the user's phone calls; and
   upon the frequency of the user moderating the speaking volume without being prompted rising over the plurality of the user's phone calls, improving a one or more of a quality or a quantity of the positive reinforcement;
   wherein the user is trained to self modulate the speaking voice.

3. The method as recited in enumerated example embodiment 1, further comprising:
   upon determining that the user does not moderate the speaking voice to a level that approximates the computed minimum sufficient volume, prompting the user to moderate the speaking voice.

4. The method as recited in one or more of enumerated example embodiment 1 or enumerated example embodiment 3 wherein one or more
   of the provision of the positive reinforcement or the prompting step comprises providing a signal that is at least audible to the user with the phone.

5. The method as recited in enumerated example embodiment 4 wherein one or more of the prompt signal or the positive reinforcement is stored at the phone.

6. The method as recited in enumerated example embodiment 4 wherein one or more of the prompt signal or the positive reinforcement is stored remotely in relation to the user's phone.

7. The method as recited in enumerated example embodiment 6 wherein one or more of the prompt signal or the positive reinforcement is stored with a component of a telephone network or system over which the user's phone is communicatively coupled with a phone of the remote conversant.

8. The method as recited in one or more of enumerated example embodiment 1 or enumerated example embodiment 4 wherein one or more of the positive reinforcement or the prompt signal is substantially inaudible to the remote conversant.

9. The method as recited in enumerated example embodiment 2 wherein the determination whether the user moderates the speaking voice without being prompted comprises determining whether the user moderates the speaking voice without being prompted within a time period.

10. The method as recited in enumerated example embodiment 9 wherein the time period comprises one or more of a pre-set time span, a threshold time span, a programmable, changeable, controllable or adjustable time span, a variable time span, or a constant time span.

11. The method as recited in enumerated example embodiment 10 wherein one or more of the threshold time span, the programmable, changeable, controllable or adjustable time span, or the variable time span is at least one of changeable, controllable, adjustable or variable based, at least in part, on a change in the frequency of the user moderating the speaking volume without being prompted.

12. The method as recited in enumerated example embodiment 11 wherein the time period changeability, controllability, adjustability or variability relates to the improvement in the quality or a quantity of the positive reinforcement.

13. The method as recited in enumerated example embodiment 12 wherein the time period changeability, controllability, adjustability or variability correspondingly relates to the improvement in the quality or a quantity of the positive reinforcement.

14. The method as recited in enumerated example embodiment 13 wherein the time period shortens as the quality or a quantity of the positive reinforcement improves;
wherein the user is further trained to self modulate the speaking voice.

15. The method as recited in enumerated example embodiment 2 wherein the positive reinforcement comprises one or more of a plurality of sounds.

16. The method as recited in enumerated example embodiment 15 wherein the one or more sounds are selectable according to a preference of the user.

17. The method as recited in enumerated example embodiment 15 wherein the one or more sounds are pre-recorded.

18. The method as recited in enumerated example embodiment 15 wherein the one or more sounds are recordable according to a preference of the user.

19. The method as recited in enumerated example embodiment 18 wherein the one or more sounds, which are recordable according to a preference of the user, comprises a variety of sounds.

20. The method as recited in enumerated example embodiment 19 wherein one or more of the variety of sounds or the user preference thereof relates to the quality or the quantity of the positive reinforcement.

21. The method as recited in enumerated example embodiment 19 wherein the quality of the positive reinforcement corresponds to a characteristic of the positive reinforcement that relates to a subjective preference of the user.

22. The method as recited in one or more of enumerated example embodiment 1 though enumerated example embodiment 4, inclusive, wherein one or more of the determining step or the monitoring step comprises:
monitoring an ambient noise level that is associated with one or more of the telephone of the user or the telephone of the remote conversant in relation to a minimum volume that suffices to allow a remote conversant, with whom the user communicates with the telephone, to perceive the speech of the user.

23. The method as recited in enumerated example embodiment 1, further comprising:
upon detecting that user moderates the user's speaking voice before the prompting step occurs, reinforcing the user's moderating behavior;
wherein, based at least in part on the reinforcing step, the user is further trained to moderate the user's telephone speaking voice.

24. The method as recited in enumerated example embodiment 1, further comprising:
upon detecting that the user's speaking voice is insufficient for the remote conversant to understand the user's speech, prompting the user in relation to the insufficient speaking volume, wherein the user is informed to raise the speaking volume to a level that is computed to suffice to allow the remote conversant to perceive the speech of the user.

25. The method as recited in one or more of enumerated example embodiment 1 or
enumerated example embodiment 2, further comprising:
monitoring an effectiveness of one or more of the providing step or the improving step; and
changing the one or more of the providing step or the improving step, wherein the effectiveness is improved;
wherein upon the change, the user is further trained to moderate the speaking voice volume.

26. The method as recited in one or more of enumerated example embodiment 1 or
enumerated example embodiment 2 wherein the moderation of the user's speaking voice volume comprises lowering the volume.

27. The method as recited in one or more of enumerated example embodiment 1 or
enumerated example embodiment 2 wherein the telephone comprises at least one of a land line connected telephone, a telephone that has a fixed geographical location, a mobile telephone, a portable telephone, a cellular telephone or a personal digital assistant (PDA) or similar computing or communicating device.

28. The method as recited in enumerated example embodiment 2 wherein the recorded result comprises a stored and indexed set of relative levels of the user speaking volume prior and subsequent to the moderating of the user speaking voice.

29. The method as recited in one or more of enumerated example embodiment 1 or enumerated example embodiment 2 wherein the computed sufficient volume level is measure in relation to a threshold level.

30. The method as recited in enumerated example embodiment 29 wherein the threshold level comprises one or more of:
a preset volume level; or
a volume level that is adjustable in response to one or more of a range or a change in an ambient noise level that is proximate to the user telephone.

31. The method as recited in enumerated example embodiment 3 wherein the prompting step comprises:
notifying the user in relation to the volume level; and
allowing the user to attempt to moderate the volume level.

32. The method as recited in enumerated example embodiment 31 wherein the allowing step comprises:
monitoring the user speaking volume upon the prompt; and
upon the user moderating the volume, reinforcing the moderation; or
upon one or more of no significant change in the speaking volume following the prompt, repeating the prompting step.

33. The method as recited in enumerated example embodiment 32 wherein the repeating step comprises augmenting the prompt.

34. The method as recited in enumerated example embodiment 32 wherein the augmenting step comprises providing an enhanced prompt.

35. The method as recited in enumerated example embodiment 32 wherein the monitoring step upon the prompt persists for a time duration that follows the prompt.

36. The method as recited in one or more of enumerated example embodiment 1 or enumerated example embodiment 2 wherein one or more of the monitoring step, the recording step or the tracking step is performed continuously, periodically, discretely or persistently.

37. The method as recited in one or more of enumerated example embodiment 1 or enumerated example embodiment 2 wherein one or more of the monitoring, determining, prompting, recording, tracking or improving steps is performed with the user's phone.

38. The method as recited in one or more of enumerated example embodiment 1 or enumerated example embodiment 2 wherein one or more of the monitoring, determining, prompting, recording, tracking or improving steps is performed remotely in relation to the user's phone.

39. The method as recited in enumerated example embodiment 38 wherein one or more of the monitoring, determining, prompting, recording, tracking or improving steps is performed with a component of a telephone or communication network or system over which the user's phone is communicatively coupled with a telephone of the remote conversant.

40. A system, comprising:

means for monitoring a speaking volume of a telephone user's voice in relation to a minimum volume that is computed to be sufficient for a remote conversant, with whom the user communicates with the telephone, to audibly perceive the user's speech;

means for determining, upon detecting that the user's monitored speaking volume exceeds the computed level that suffices to allow the remote conversant to perceive the user's speech, whether the user moderates the speaking voice, without being prompted in relation to the excessive speaking volume, to a level that at least approximates the computed minimum sufficient volume;

means for providing a positive reinforcement to the user upon determining that the user moderates the speaking voice, without being prompted, to a level that approximates the computed minimum sufficient volume.

41. The system as recited in enumerated example embodiment 40, further comprising:

means for recording a result for the monitoring step and the determining step over a plurality of the user's phone calls;

means for tracking, from the recorded result, whether a frequency of the user moderating the speaking volume without being prompted rises over the plurality of the user's phone calls; and means for improving a one or more of a quality or a quantity of the positive reinforcement upon the frequency of the user moderating the speaking volume without being prompted rising over the plurality of the user's phone calls;

wherein the system means train the user to self modulate the speaking voice.

42. A system, comprising:

a monitor that tracks a speaking volume of a telephone user's voice in relation to a minimum volume that is computed to be sufficient for a remote conversant, with whom the user communicates with the telephone, to audibly perceive the user's speech;

a controller that, upon the monitor detecting that the user's monitored speaking volume exceeds the computed level that suffices to allow the remote conversant to perceive the user's speech, determines whether the user moderates the speaking voice, without being prompted in relation to the excessive speaking volume, to a level that at least approximates the computed minimum sufficient volume; and a training agent that, upon the controller determining that the user moderates the speaking voice, without being prompted, to a level that approximates the computed minimum sufficient volume, provides a positive reinforcement to the user.

43. The system as recited in enumerated example embodiment 42, further comprising:

a recorder that records a result for the monitor and the controller over a plurality of the user's phone calls;

a tracker that, from the recorded result, tracks whether a frequency of the user moderating the speaking volume without being prompted rises over the plurality of the user's phone calls; and an enhancer that, upon the frequency of the user moderating the speaking volume without being prompted rising over the plurality of the user's phone calls, improves one or more of a quality or a quantity of the positive reinforcement, wherein the system provides training to a user, wherein the user is trained to self modulate the speaking voice.

44. The system as recited in one or more of enumerated example embodiment 42 or enumerated example embodiment 43 wherein at least a portion of the system comprises, or is disposed with, a component of the telephone.

45. The system as recited in one or more of enumerated example embodiment 42 or enumerated example embodiment 43 wherein at least a portion of the system comprises, or is disposed with, a component of one or more of a communications medium or a network with which the telephone functions.

46. The system as recited in one or more of enumerated example embodiment 42, enumerated example embodiment 43, enumerated example embodiment 44 or enumerated example embodiment 45 wherein the communications medium comprises a network.

47. The system as recited in enumerated example embodiment 46 wherein the network comprises one or more of a telephone system or the Internet.

48. An apparatus, comprising:

one or more processors; and a computer readable storage medium that comprises instructions, which when executed or performed by the one or more processors, causes or controls the one or more processors to:

perform, execute or control a method as recited in one or more steps of one or more of enumerated example embodiments 1-39; or control, configure, program or function within one or more of the systems as recited in one or more of enumerated example embodiments 40-47.

49. An integrated circuit (IC) device that comprises one or more active elements, wherein the active elements are disposed, arrayed, configured, programmed or controlled to:

perform, execute or control a method as recited in one or more steps of one or more of enumerated example embodiments 1-39; or control, configure, program or function within one or more of the systems as recited in one or more of enumerated example embodiments 40-47 or the apparatus as recited in enumerated example embodiment 48.

50. The IC device as recited in enumerated example embodiment 49 wherein the IC comprises at least one of a microprocessor, a programmable logic device, an application specific IC (ASIC), a digital signal processor (DSP), a field programmable gate array (FPGA) or a microcontroller.

51. The IC device as recited in one or more of enumerated example embodiment 49 or enumerated example embodiment 50 wherein the IC device comprises a component of at least one of:

a telephone;

a computing system, device or apparatus; or a communicating system, device or apparatus.

52. A use for a computer, comprising one or more of:

performing, executing or controlling a method as recited in one or more steps of one or more of enumerated example embodiments 1-39; or programming, controlling, configuring, or functioning with one or more of the systems as recited in one or more of enumerated example embodiments 39-44, the apparatus as recited in enumerated example embodiment 45 or the IC devices as recited in one or more of enumerated example embodiment 49, enumerated example embodiment 50 or enumerated example embodiment 51.

53. A computer readable storage medium comprising encoded instructions, which when executed with one or more processors, programs, causes or controls the processors to:

perform, execute or control a method as recited in one or more steps of one or more of enumerated example embodiments 1-39; or control, configure or program one or more of the systems, apparatus, IC devices or computer use as recited in one or more of enumerated example embodiments 40-52.

Equivalents, Extensions, Alternatives And Miscellaneous

Example embodiments of telephone enhancements are thus described. In the foregoing specification, embodiments of the present invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method, comprising:

monitoring a speaking volume of a telephone user's voice in relation to a minimum volume that is computed to be sufficient for a remote conversant, with whom the user communicates with the telephone, to audibly perceive the user's speech;

upon detecting that the user's monitored speaking volume exceeds the computed level that suffices to allow the remote conversant to perceive the user's speech, determining whether the user moderates the speaking voice, without being prompted in relation to the excessive speaking volume, to a level that at least approximates the computed minimum sufficient volume;

upon determining that the user moderates the speaking voice, without being prompted, to a level that approximates the computed minimum sufficient volume, providing a positive reinforcement to the user;

recording a result for the monitoring step and the determining step over a plurality of the user's phone calls;

from the recorded result, tracking whether a frequency of the user moderating the speaking volume without being prompted rises over the plurality of the user's phone calls; and upon the frequency of the user moderating the speaking volume without being prompted rising over the plurality of the user's phone calls, improving a one or more of a quality or a quantity of the positive reinforcement;

wherein the user is trained to self modulate the speaking voice.

2. The method as recited in claim 1, further comprising:

upon determining that the user does not moderate the speaking voice to a level that approximates the computed minimum sufficient volume, prompting the user to moderate the speaking voice.

3. The method as recited in claim 2 wherein one or more of the provision of the positive reinforcement or the prompting step comprises providing a signal that is at least audible to the user with the phone.

4. The method as recited in claim 3 wherein one or more of the prompt signal or the positive reinforcement is stored at the phone.

5. The method as recited in claim 3 wherein one or more of the prompt signal or the positive reinforcement is stored remotely in relation to the user's phone.

6. The method as recited in claim 5 wherein one or more of the prompt signal or the positive reinforcement is stored with a component of a telephone network or system over which the user's phone is communicatively coupled with a phone of the remote conversant.

7. The method as recited in claim 1 wherein one or more of the positive reinforcement or the prompt signal is substantially inaudible to the remote conversant.

8. The method as recited in claim 1 wherein the determination whether the user moderates the speaking voice without being prompted comprises determining whether the user moderates the speaking voice without being prompted within a time period.

9. The method as recited in claim 8 wherein the time period comprises one or more of a pre-set time span, a threshold time span, a programmable, changeable, controllable or adjustable time span, a variable time span, or a constant time span.

10. The method as recited in claim 9 wherein one or more of the threshold time span, the programmable, changeable, controllable or adjustable time span, or the variable time span is at least one of changeable, controllable, adjustable or variable based, at least in part, on a change in the frequency of the user moderating the speaking volume without being prompted.

11. The method as recited in claim 10 wherein the time period changeability, controllability, adjustability or variability relates to the improvement in the quality or a quantity of the positive reinforcement.

12. The method as recited in claim 11 wherein the time period changeability, controllability, adjustability or variability correspondingly relates to the improvement in the quality or a quantity of the positive reinforcement.

13. The method as recited in claim 12 wherein the time period shortens as the quality or a quantity of the positive reinforcement improves;

wherein the user is further trained to self modulate the speaking voice.

14. The method as recited in claim 1 wherein the positive reinforcement comprises one or more of a plurality of sounds.

15. The method as recited in claim 14 wherein the one or more sounds are selectable according to a preference of the user.

16. The method as recited in claim 14 wherein the one or more sounds are pre-recorded.

17. The method as recited in claim 14 wherein the one or more sounds are recordable according to a preference of the user.

18. The method as recited in claim 17 wherein the one or more sounds, which are recordable according to a preference of the user, comprises a variety of sounds.

19. A system, comprising:

means for monitoring a speaking volume of a telephone user's voice in relation to a minimum volume that is computed to be sufficient for a remote conversant, with whom the user communicates with the telephone, to audibly perceive the user's speech;

means for determining, upon detecting that the user's monitored speaking volume exceeds the computed level that suffices to allow the remote conversant to perceive the user's speech, whether the user moderates the speaking voice, without being prompted in relation to the excessive speaking volume, to a level that at least approximates the computed minimum sufficient volume;

means for providing a positive reinforcement to the user upon determining that the user moderates the speaking voice, without being prompted, to a level that approximates the computed minimum sufficient volume;

means for recording a result for the monitoring step and the determining step over a plurality of the user's phone calls;

means for tracking, from the recorded result, whether a frequency of the user moderating the speaking volume without being prompted rises over the plurality of the user's phone calls; and means for improving a one or more of a quality or a quantity of the positive reinforcement upon the frequency of the user moderating the speaking volume without being prompted rising over the plurality of the user's phone calls;

wherein the system means train the user to self modulate the speaking voice.

20. A system, comprising:

a monitor that tracks a speaking volume of a telephone user's voice in relation to a minimum volume that is computed to be sufficient for a remote conversant, with whom the user communicates with the telephone, to audibly perceive the user's speech;

a controller that, upon the monitor detecting that the user's monitored speaking volume exceeds the computed level that suffices to allow the remote conversant to perceive the user's speech, determines whether the user moderates the speaking voice, without being prompted in relation to the excessive speaking volume, to a level that at least approximates the computed minimum sufficient volume; and a training agent that, upon the controller determining that the user moderates the speaking voice, without being prompted, to a level that approximates the computed minimum sufficient volume, provides a positive reinforcement to the user;

a recorder that records a result for the monitor and the controller over a plurality of the user's phone calls;

a tracker that, from the recorded result, tracks whether a frequency of the user moderating the speaking volume without being prompted rises over the plurality of the user's phone calls; and an enhancer that, upon the frequency of the user moderating the speaking volume without being prompted rising over the plurality of the user's phone calls, improves one or more of a quality or a quantity of the positive reinforcement, wherein the system provides training to a user, wherein the user is trained to self modulate the speaking voice.

21. The system as recited in claim 20 wherein at least a portion of the system comprises, or is disposed with, a component of the telephone.

22. The system as recited in claim 20 wherein at least a portion of the system comprises, or is disposed with, a component of one or more of a communications medium or a network with which the telephone functions.

23. The system as recited in claim 22 wherein the communications medium comprises a network.

24. The system as recited in claim 23 wherein the network comprises one or more of a telephone system or the Internet.

25. A computer readable storage medium comprising instructions that are encoded therewith, which when executed with one or more processors, programs, causes or controls the processors to perform, execute or control a method, the method comprising the steps of:

monitoring a speaking volume of a telephone user's voice in relation to a minimum volume that is computed to be sufficient for a remote conversant, with whom the user communicates with the telephone, to audibly perceive the user's speech;

upon detecting that the user's monitored speaking volume exceeds the computed level that suffices to allow the remote conversant to perceive the user's speech, determining whether the user moderates the speaking voice, without being prompted in relation to the excessive speaking volume, to a level that at least approximates the computed minimum sufficient volume;

upon determining that the user moderates the speaking voice, without being prompted, to a level that approximates the computed minimum sufficient volume, providing a positive reinforcement to the user;

recording a result for the monitoring step and the determining step over a plurality of the user's phone calls;

from the recorded result, tracking whether a frequency of the user moderating the speaking volume without being prompted rises over the plurality of the user's phone calls; and upon the frequency of the user moderating the speaking volume without being prompted rising over the plurality of the user's phone calls, improving a one or more of a quality or a quantity of the positive reinforcement;

wherein the user is trained to self modulate the speaking voice.

26. The computer readable storage medium as recited in claim 25 wherein the method further comprises the steps of:

upon determining that the user does not moderate the speaking voice to a level that approximates the computed minimum sufficient volume, prompting the user to moderate the speaking voice.

* * * * *